US006328576B1

(12) United States Patent
Takahashi

(10) Patent No.: US 6,328,576 B1
(45) **Date of Patent: *Dec. 11, 2001**

(54) SUBSTRATE-USE TERMINAL STRUCTURE USING RECTANGULAR ROD

(75) Inventor: Toshiharu Takahashi, Shizuoka (JP)

(73) Assignee: Yazaki Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/473,707

(22) Filed: Dec. 29, 1999

(30) Foreign Application Priority Data

Feb. 19, 1999 (JP) ........................................ 11-041930

(51) Int. Cl.[7] ........................................ H05K 1/00
(52) U.S. Cl. ........................................ 439/78; 439/733.1
(58) Field of Search ........................................ 439/78, 733.1, 439/87, 751, 79, 873, 84, 869, 82

(56) References Cited

U.S. PATENT DOCUMENTS 4,969,259 * 11/1990 Macek et al. .......................... 29/845
5,263,880 * 11/1993 Schwarz et al. .................. 439/733.1
5,692,928 * 12/1997 Nelson et al. .................... 439/733.1
5,897,401 * 4/1999 Fili et al. .......................... 439/733.1
6,042,429 * 3/2000 Bianca et al. ..................... 439/733.1
6,152,782 * 11/2000 Volkert et al. .................... 439/733.1

* cited by examiner

*Primary Examiner*—Gary Paumen
*Assistant Examiner*—Ross Gushi
(74) *Attorney, Agent, or Firm*—Sughrue, Mion, PLLC

(57) ABSTRACT

In a substrate-use terminal structure using a rectangular rod in accordance with the present invention, two pairs of first retaining section 13, which is held in a terminal holding hole, projections 14 are formed on both lateral side portions of a retaining in an intermediate portion of a substrate-use terminal 12, so as to be press-fitted to both side walls of the terminal holding hole. In addition, a second retaining projection 15 having the shape of a vertically elongated section is provided between the pairs of first retaining projections 14 so as to be press-fitted to at least one of the top wall and the bottom wall in the vertical direction.

2 Claims, 7 Drawing Sheets

SUBSTRATE-USE TERMINAL STRUCTURE USING RECTANGULAR ROD

BACKGROUND OF INVENTION

1. Field of invention

The present invention relates to a terminal structure for relatively small electric current which is used in the electrical connection of various equipment mounted in an automobile or the like, and more particularly to a substrate-use terminal structure using a rectangular rod and press-fitted and held in a terminal holding wall of a connector housing.

2. Related art

Conventionally, various terminal structures have been known as substrate-use terminal structures using rectangular rods.

In a conventional substrate-use terminal structure 51 using a rectangular rod, which is shown in FIGS. 7 and 8, substrate-use terminals 52 formed of rectangular rods are respectively press-fitted and held in a plurality of terminal holding holes 4 provided in a terminal holding wall 3 of a connector housing 2. Two pairs of first retaining projections 54, which are respectively formed so as to be press-fitted to both side walls 5 of the terminal holding hole 4, are formed on both sides of a retaining section 53 of the substrate-use terminal 52 which is held in the terminal holding hole 4.

More specifically, an electrical contact portion 55, which has its height increased by being subjected to forging by being pressed from its lateral directions, is formed in a front portion of the substrate-use terminal 52, and is adapted to be electrically connected to an electrical contact portion of a mating connector. Further, an electrical connection portion 56 which retains the cross-sectional shape of the rectangular rod is formed in a rear portion of the substrate-use terminal 52, and is passed through a circuit pattern of a substrate 8 mounted on the rear surface of the connector housing 2 and is soldered thereto.

With the substrate-use terminal structure 51 using a rectangular rod in the above-described construction, a C—C section including the first retaining projections 54 located in the retaining section 53 of the substrate-use terminal 52 is shown in FIG. 9. If this substrate-use terminal 52 is press-fitted into the terminal holding hole 4 located in the terminal holding wall 3 of the connector housing 2, the first retaining projections 54 are fixed by being interference-fitted by means of a lap-fitting allowance with respect to both side walls 5 of the terminal holding hole 4.

However, with the conventional substrate-use terminal structure 51 using a rectangular rod, since the lap-fitting allowance is provided only in the horizontal direction between the first retaining projections and both side walls 5 of the terminal holding hole 4, there has been a problem in that the substrate-use terminal 52 has play in the vertical direction, and the holding force declines due to the play.

SUMMARY OF INVENTION

The present invention has been devised in view of the above-described problem, and its object is to provide a substrate-use terminal structure using a rectangular rod which, even if the substrate-use terminal is inserted into a terminal holding hole of a connector housing, does not exhibit play in the vertical direction, and does not cause the holding force to decline.

In accordance with the present invention, the above-described problem is overcome by a substrate-use terminal structure formed of a rectangular rod in which substrate-use terminals are each press-fitted and held in a plurality of terminal holding holes provided through a terminal holding wall of a connector housing, comprising: a pair of first retaining projections formed horizontally on a retaining section of the substrate-use terminal held in the terminal holding hole, so as to be pressed-fitted to both side walls of the terminal holding hole; and a second retaining projection formed in a vertical direction on the retaining section of the substrate-use terminal held in the terminal holding hole, so as to be press-fitted to at least one of a top wall and a bottom wall of the terminal holding hole.

In addition, in the above-described substrate-use terminal structure using a rectangular rod, wherein a protrusion is provided on at least one of the first retaining projection and the second retaining projection.

In accordance with the substrate-use terminal structure using a rectangular rod having the above-described construction, the pair of first retaining projections are formed in the horizontal direction on the retaining section of the substrate-use terminal which is held in the terminal holding hole, so as to be press-fitted to both side walls of the terminal holding hole, and the second retaining projection is provided in the vertical direction on the retaining section of the substrate-use terminal which is held in the terminal holding hole, so as to be press-fitted to at least one of the top wall and the bottom wall of the terminal holding hole.

Accordingly, the substrate-use terminal is press-fitted to both side walls of the terminal holding hole by means of the first retaining projections, and is also press-fitted to at least one of the top wall and the bottom wall by means of the second retaining projection. Hence, it is possible to obtain a highly reliable substrate-use connector in which the holding force in the horizontal and vertical directions is enhanced, and there is no play.

In addition, if the protrusion is provided on a distal end portion of at least one of the first retaining projection and the second retaining projection, it is possible to provide a large lap-fitting allowance with respect to the top wall or the bottom wall of the terminal holding hole, and the lap-fitting area can be decreased, so that the press-fitting force can be reduced. Hence, it is possible to improve the efficiency in inserting the substrate-use terminals into the housing.

DETAILED DESCRIPTION OF DRAWINGS

DETAILED DESCRIPTION OF PREFERRED EMBODIMENTS

Figure 1:
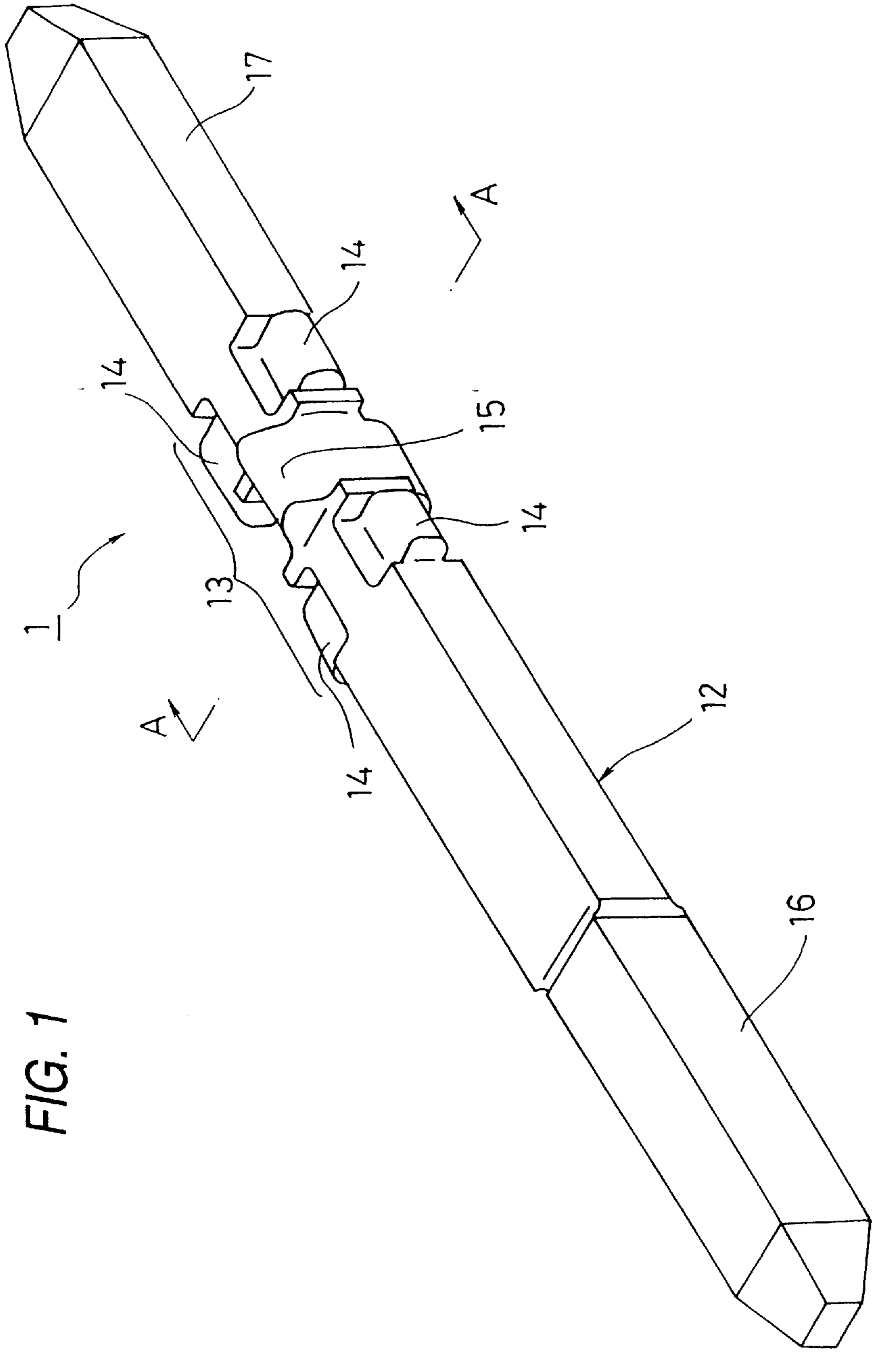
FIG. 1 is a perspective view illustrating a first embodiment of a substrate-use terminal structure using a rectangular rod in accordance with the present invention.
Figure 2:
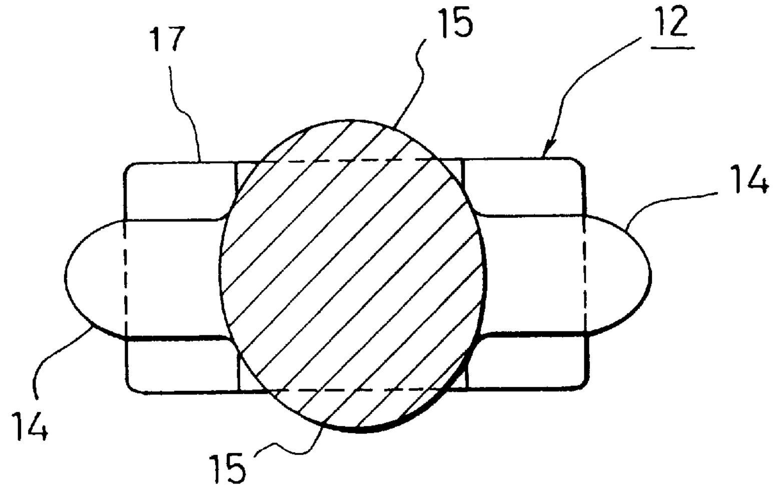
FIG. 2 is a cross-sectional view which is taken along line A—A in FIG. 1 and includes second retaining projections.
Figure 3:
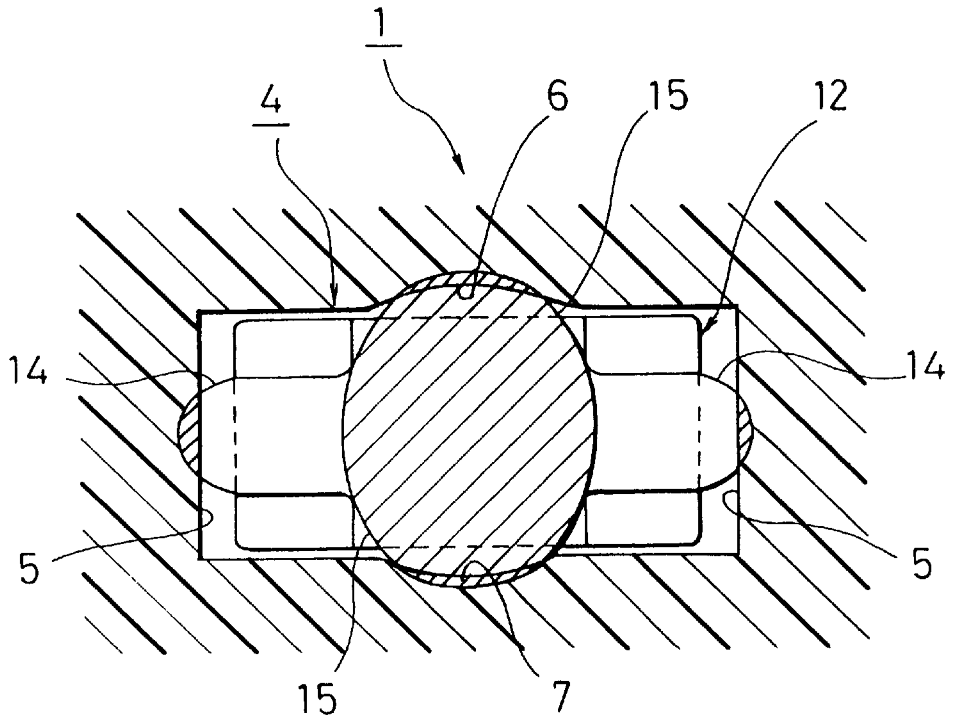
FIG. 3 is an explanatory diagram concerning the operation illustrating a state in which the substrate-use terminal is press-fitted in a terminal holding hole in FIG. 1.
Figure 4:
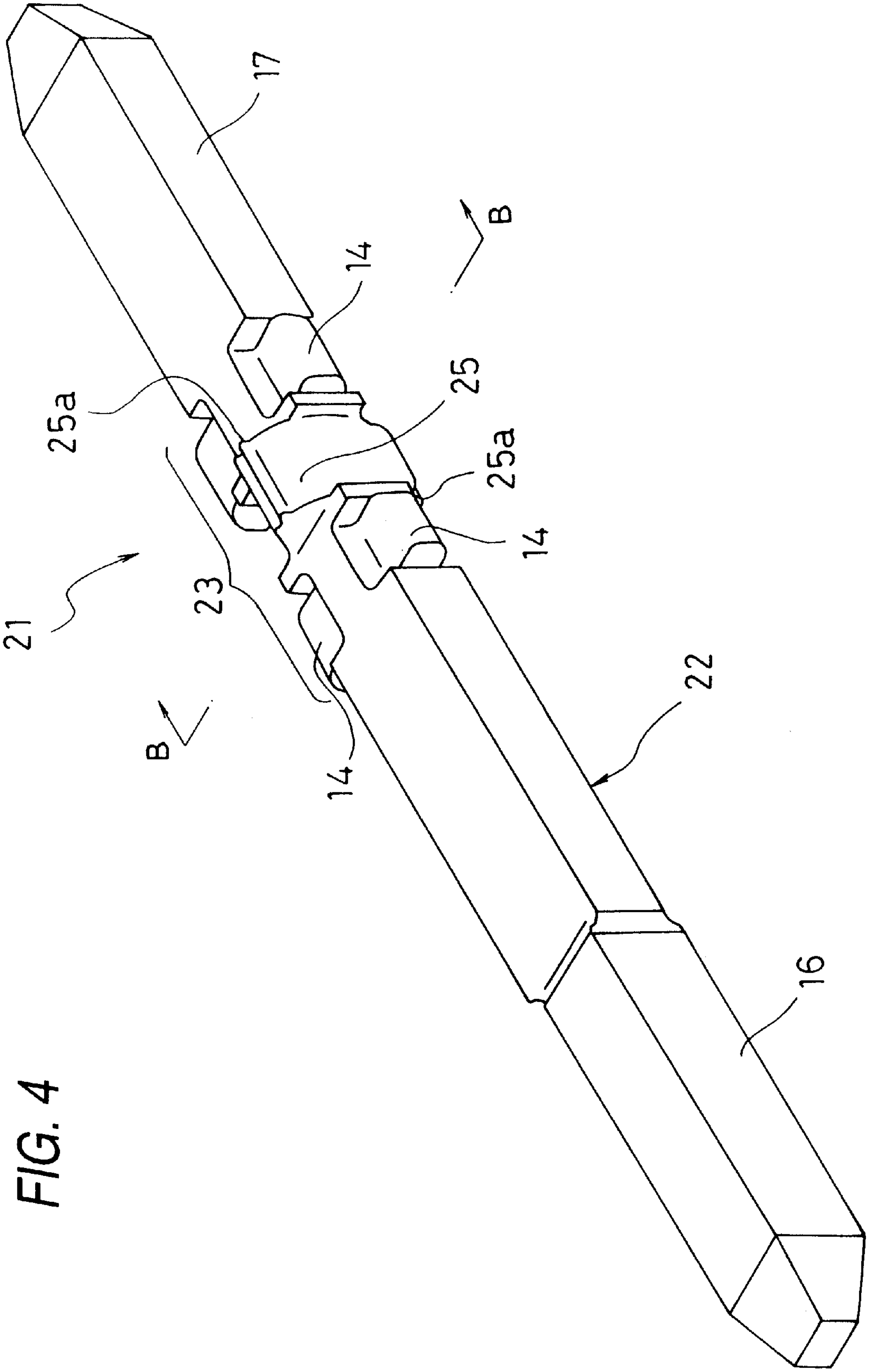
FIG. 4 is a perspective view illustrating a second embodiment of the substrate-use terminal structure using a rectangular rod in accordance with the present invention.
Figure 5:
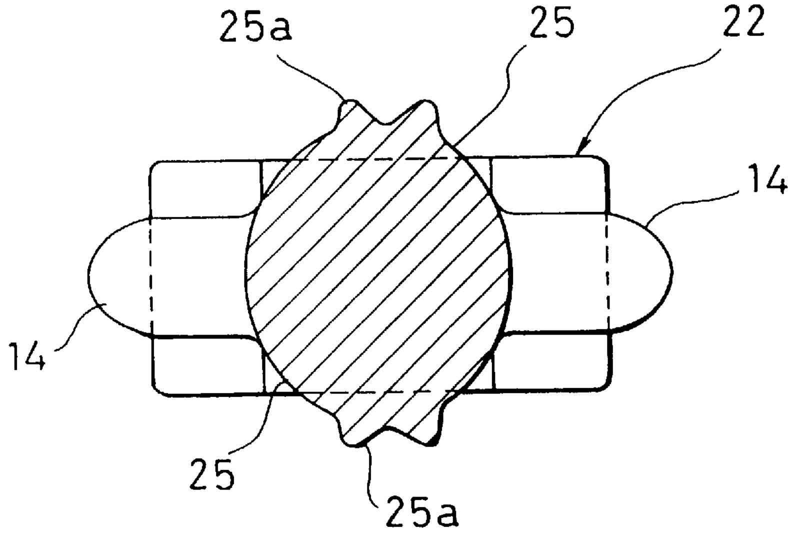
FIG. 5 is a cross-sectional view which is taken along line B—B in FIG. 4 and includes second retaining projections.
Figure 6:
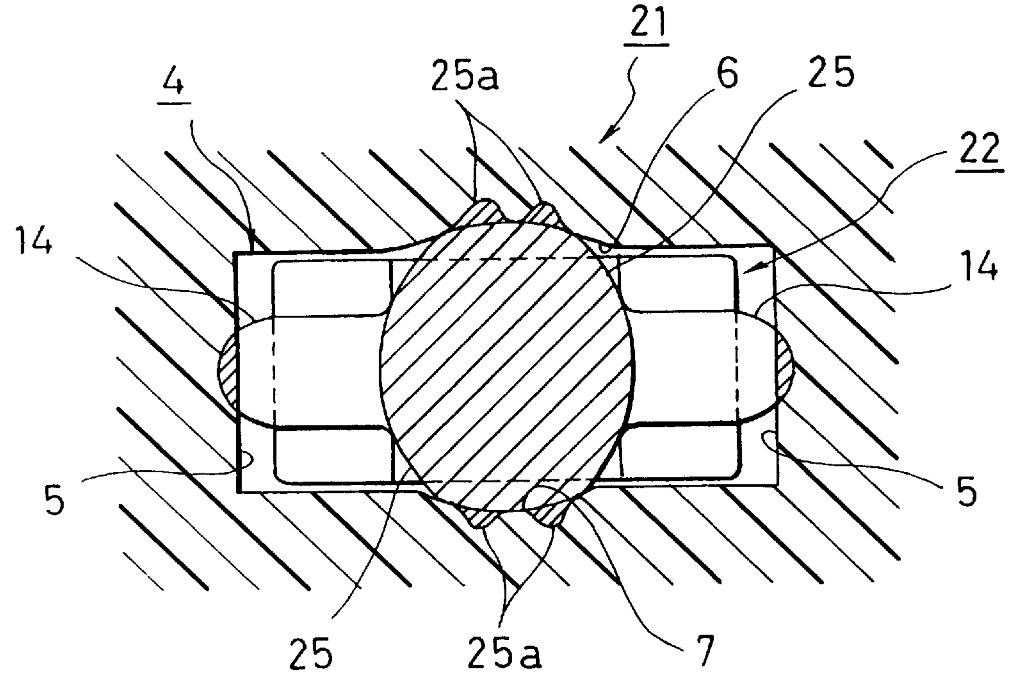
FIG. 6 is an explanatory diagram concerning the operation illustrating the state in which the substrate-use terminal is press-fitted in the terminal holding hole in FIG. 4.
Figure 7:
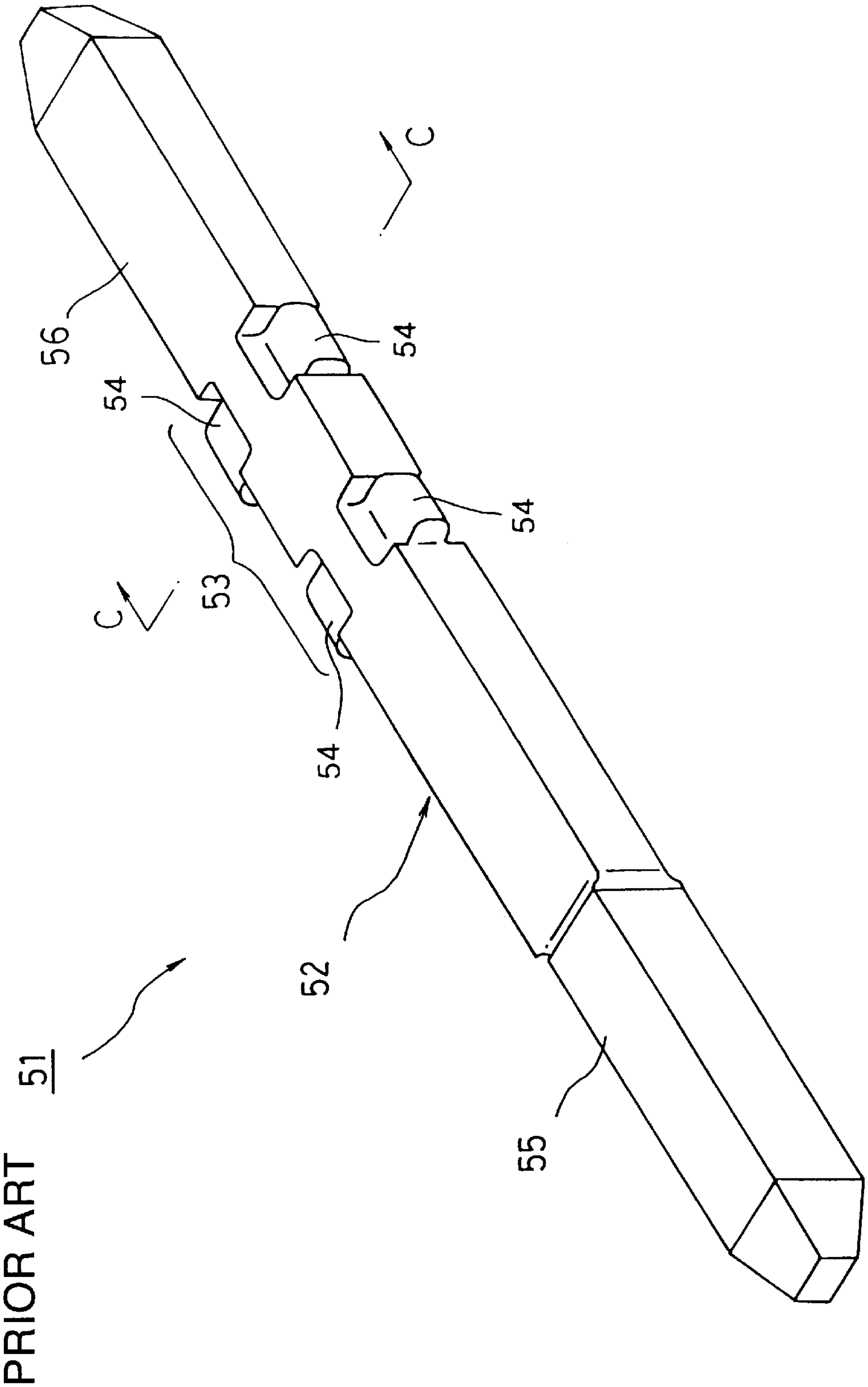
FIG. 7 PRIOR ART
FIG. 7 is a perspective view illustrating an example of a conventional terminal structure using a rectangular rod.

Referring now to FIGS. 1 to 6, a description will be given of the embodiments of a substrate-use terminal structure using a rectangular rod in accordance with the present invention. FIG. 1 is a perspective view illustrating a first embodiment of the substrate-use terminal structure using a rectangular rod in accordance with the present invention. FIG. 2 is a cross-sectional view which is taken along line A—A in FIG. 1 and includes second retaining projections. FIG. 3 is an explanatory diagram concerning the operation illustrating a state in which the substrate-use terminal is press-fitted in a terminal holding hole in FIG. 1. FIG. 4 is a perspective view illustrating a second embodiment of the substrate-use terminal structure using a rectangular rod in accordance with the present invention. FIG. 5 is a cross-sectional view which is taken along line B—B in FIG. 4 and includes second retaining projections. FIG. 6 is an explanatory diagram concerning the operation illustrating the state in which the substrate-use terminal is press-fitted in the terminal holding hole in FIG. 4.

Figure 8:
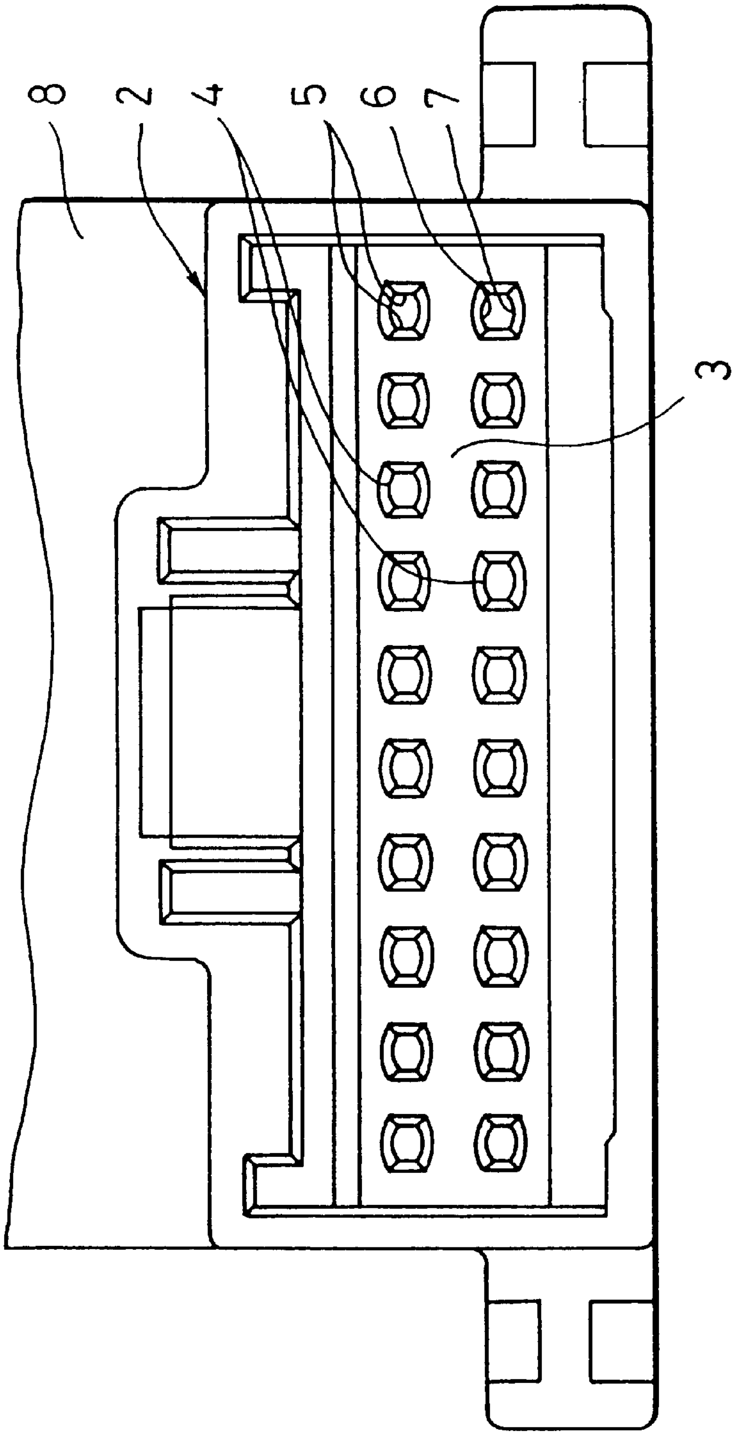
FIG. 8 PRIOR ART
FIG. 8 is a front elevational view of a connector housing.
Figure 9:
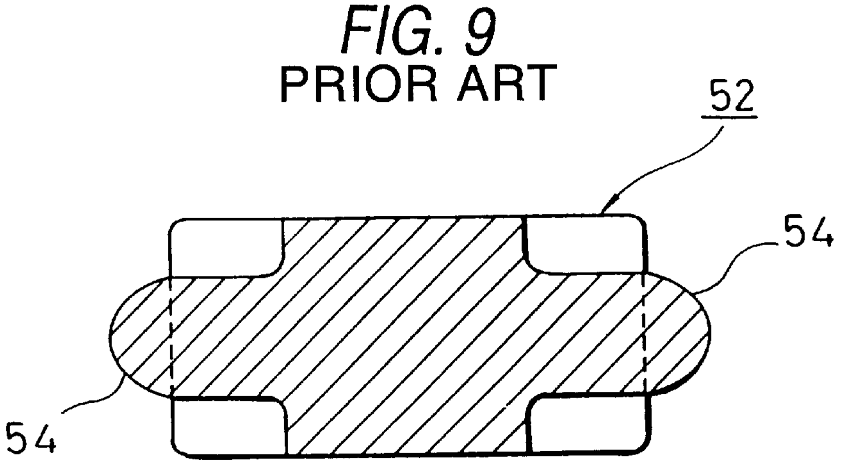
FIG. 9 PRIOR ART
FIG. 9 is a cross-sectional view which is taken along line C—C in FIG. 7 and includes first retaining projections.
Figure 10:
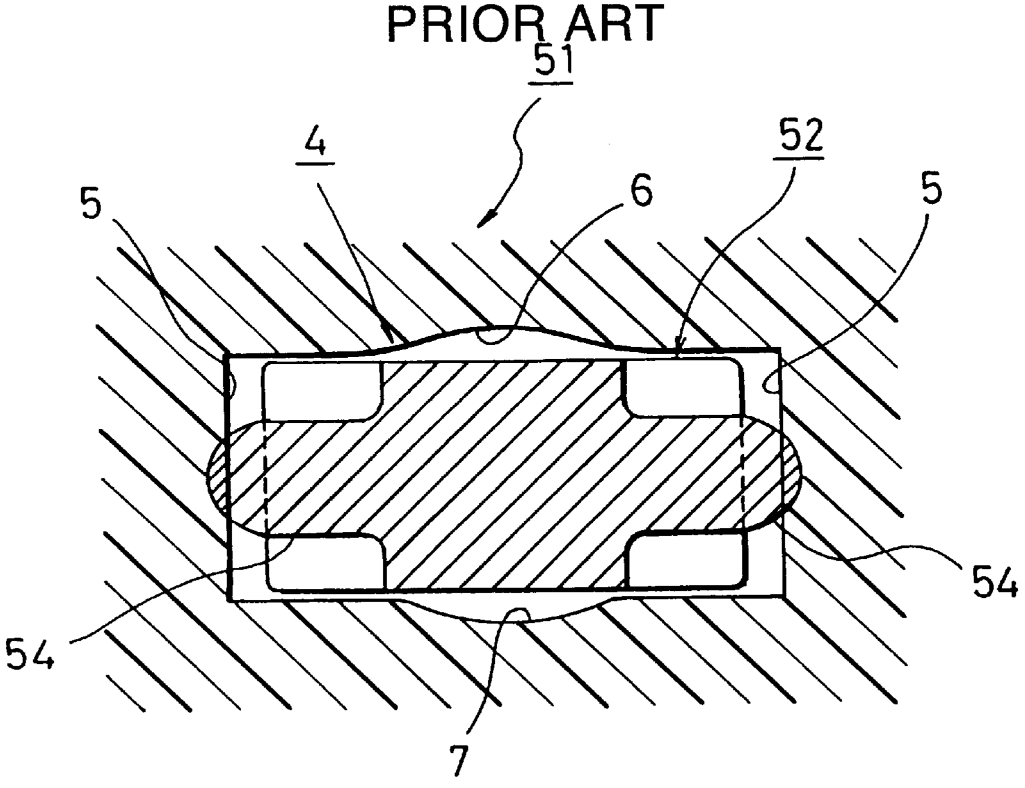
FIG. 10 PRIOR ART
FIG. 10 is an explanatory diagram concerning the operation illustrating the state in which the substrate-use terminal is press-fitted in the terminal holding hole in FIG. 7.

Substrate-use terminals 12 in a substrate-use terminal structure 1 using rectangular rods in accordance with the first embodiment of the present invention are respectively press-fitted and held in a plurality of terminal holding holes 4 provided in a terminal holding wall 3 of a connector housing 2 shown in FIG. 8.

As shown in FIG. 1, in the substrate-use terminal 12 of this embodiment, an electrical contact portion 16, which has its height increased by being subjected to forging by being pressed from its lateral directions, is formed in its front portion, and is adapted to be electrically connected to an electrical contact portion of a mating connector. Further, an electrical connection portion 17 which retains the shape of the rectangular rod is formed in a rear portion of the substrate-use terminal 12, and is passed through a circuit pattern of a substrate 8 mounted on the rear surface of the connector housing 2 and is soldered thereto.

In addition, in an intermediate portion of the substrate-use terminal 12, two pairs of first retaining projections 14, which are respectively formed so as to be press-fitted to both side walls 5 of the terminal holding hole 4, are formed on both lateral sides of a retaining section 13 which is held in the terminal holding hole 4.

Further, in the substrate-use terminal 12 of this embodiment, a second retaining projection 15 is provided between the two pairs of first retaining projections 14 so as to be press-fitted to at least of one of a top wall 6 and a bottom wall 7 in the vertical direction (in FIG. 2, a pair of second retaining projections 15, which together form a cross-sectional shape of a vertically elongated ellipse, are provided).

With the substrate-use terminal structure 1 using a rectangular rod having the above-described construction, as shown in FIG. 3, if the substrate-use terminal 12 is press-fitted in the terminal holding hole 4 of the connector housing, the first retaining projections 14 are fixed by being interference-fitted to both side walls 5 of the terminal holding hole 4 since there is a lap fitting allowance with respect to both side walls 5 of the terminal holding hole 4. Also, the second retaining projections 15 are fixed by being interference-fitted to the top wall 6 and the bottom wall 7 of the terminal holding hole 4 since there is a lap fitting allowance with respect to the top wall 6 and the bottom wall 7.

As described above, with the substrate-use terminal structure 1 using a rectangular rod in accordance with this embodiment, the two pairs of first retaining projections 14, which are respectively press-fitted to both side walls 5 of the terminal holding hole 4, are formed on both sides of the retaining section 13 of the substrate-use terminal 12 which is held in the terminal holding hole 4, and the pair of second retaining projections 15, which are similarly press-fitted to the top wall 6 and the bottom wall 7 of the terminal holding hole 4, are provided in the vertical direction on the retaining section 13.

Accordingly, the substrate-use terminal 12 is press-fitted to both side walls 5 of the holding hole 4 by means of the first retaining projections 14, and is press-fitted to the top wall 6 and the bottom wall 7 by means of the second retaining projections 15. Accordingly, since there is no play in both the horizontal and vertical directions, the holding force within the connector housing can be ensured, and it is possible to obtain a substrate-use connector which has high reliability.

Referring next to FIGS. 4 to 6, a description will be given of a second embodiment of the substrate-use terminal structure using a rectangular rod in accordance with the present invention. It should be noted that this embodiment differs from the above-described first embodiment in the arrangement of the second retaining projections, and portions of the identical arrangement are denoted by the same reference numerals, and a description thereof will be omitted.

As shown in FIGS. 4 and 5, in a substrate-use terminal structure 21 using a rectangular rod in this embodiment, a pair of retaining projections 25 in a retaining section 23 of a substrate-use terminal 22 together form a vertically elongated elliptical shape, and a pair of rib-like protrusions **25*a* are formed in each long-diameter portion corresponding to the vertical direction. These rib-like projections 25*a*** are formed by being subjected to forging by being pressed from both side surfaces of the rectangular rod.

With the substrate-use terminal structure 21 using a rectangular rod having the above-described construction, as shown in FIG. 6, if the substrate-use terminal 22 is press-fitted in the terminal holding hole 4 of the connector housing, the first retaining projections 14 are fixed by being interference-fitted to both side walls 5 of the terminal holding hole 4 since there is a lap fitting allowance with respect to both side walls 5 of the terminal holding hole 4. Also, the second retaining projections 25 are fixed by being interference-fitted to the top wall 6 and the bottom wall 7 of the terminal holding hole 4 since there is a lap fitting allowance with respect to the top wall 6 and the bottom wall 7.

At this time, the rib-like protrusions **25*a* have a large interference with respect to the top wall 6 and the bottom wall 7, and their lap-fitting area is small, so that the press-fitting force in the terminal holding hole 4** can be made small.

As described above, with the substrate-use terminal structure 21 using a rectangular rod in accordance with this embodiment, the two pairs of first retaining projections 14, which are respectively press-fitted to both side walls 5 of the terminal holding hole 4, are formed on both sides of the retaining section 23 of the substrate-use terminal 22, which is held in the terminal holding hole 4, and the pair of second retaining projections 25 each having the rib-like protrusions

25*a*, which are press-fitted to the top wall 6 and the bottom wall 7 of the terminal holding hole 4 in the vertical direction of the retaining section 23.

Accordingly, the substrate-use terminal 22 is press-fitted to both side walls 5 of the holding hole 4 by means of the first retaining projections 14, and is press-fitted to the top wall 6 and the bottom wall 7 by means of the rib-like protrusions 25*a* of the second retaining projections 15. Accordingly, since the rib-like protrusions 25*a* have a large interference with respect to the top wall 6 and the bottom wall 7, and their lap-fitting area is small, the press-fitting force in the terminal holding hole 4 can be made small. In addition, since there is no play in both the horizontal and vertical directions, the holding force within the connector housing can be ensured, and it is possible to improve the efficiency in inserting the substrate-use terminals into the terminal holding holes.

It should be noted that the present invention is not limited to the foregoing embodiments, and may be implemented in other forms by effecting appropriate modifications. For example, although the second retaining projections 25 are provided between the two pairs of first retaining projections 14 in the second embodiment, the first retaining projections 14 need not necessarily be provided in two pairs, and an arrangement may be adopted in which the first and second retaining projections 14 and 25 are each provided in one pair.

In addition, although the rib-like protrusions 25*a* are provided on the second retaining projections 25, an arrangement may be adopted in which the rib-like protrusions 25*a* are provided on the first retaining projections 14. Further, although the rib-like protrusions 25*a* are provided in a pair, only one rib-like protrusion 25*a* may be provided.

As described above, with the substrate-use terminal structure using a rectangular rod in accordance with the present invention, the pair of first retaining projections are formed in the horizontal direction on the retaining section of the substrate-use terminal which is held in the terminal holding hole, so as to be press-fitted to both side walls of the terminal holding hole, and the second retaining projection is provided in the vertical direction on the retaining section of the substrate-use terminal which is held in the terminal holding hole, so as to be press-fitted to at least one of the top wall and the bottom wall of the terminal holding hole.

Accordingly, the substrate-use terminal is press-fitted to both side walls of the terminal holding hole by means of the first retaining projections, and is also press-fitted to at least one of the top wall and the bottom wall by means of the second retaining projection. Hence, it is possible to obtain a highly reliable substrate-use connector in which the holding force in the horizontal and vertical directions is enhanced, and there is no play.

In addition, if the protrusion is provided on a distal end portion of at least one of the first retaining projection and the second retaining projection, it is possible to provide a large lap-fitting allowance with respect to the top wall or the bottom wall of the terminal holding hole, and the lap-fitting area can be decreased, so that the press-fitting force can be reduced. Hence, it is possible to improve the efficiency in inserting the substrate-use terminals into the housing.

What is claimed is:

1. A substrate -use terminal structure formed of a rectangular rod comprising:

substrate-use terminals each press-fitted and held in a plurality of terminal holding holes provided through a terminal holding wall of a connector housing;

first retaining projections formed horizontally on a retaining section of said substrate-use terminal held in said terminal holding hole, so as to be press-fitted to both sidewalls of said terminal holding hole; and a second retaining projection formed in a vertical direction on said retaining section of said substrate-use terminal held in said terminal holding hole, so as to be press-fitted to at least one of a top wall and a bottom wall of said terminal holding hole; and wherein at least one of said first and second retaining projections has an elliptical shape said first retaining projections are formed at least partially offset from said second retaining portions.

2. The substrate-use terminal structure according to claim 1, wherein at least one of said first retaining projection and said second retaining projection has a protrusion at a tip end thereof.

* * * * *